United States Patent [19]

Bouverot et al.

[11] 4,075,553

[45] Feb. 21, 1978

[54] ELECTROMAGNETIC DETECTOR RESPONSIVE TO A MODIFICATION OF RADIATED FIELD BY AN INTRUDING METALLIC OBJECT

[75] Inventors: René Bouverot; Jean-Raymond Narbaits-Jaureguy, both of Paris, France

[73] Assignee: Thomson-CSF, Paris, France

[21] Appl. No.: 729,802

[22] Filed: Oct. 5, 1976

[30] Foreign Application Priority Data

Oct. 7, 1975 France ............................ 75 30695

[51] Int. Cl.$^2$ ............................ G01R 33/12

[52] U.S. Cl. ............................ 324/233; 340/38 L

[58] Field of Search ............................ 324/3, 41, 43, 67; 340/38 L

[56] References Cited

U.S. PATENT DOCUMENTS

| | | | |
|---|---|---|---|
| 661,520 | 11/1900 | Haskins | 324/43 |
| 2,160,356 | 5/1939 | Fore et al. | 324/41 |
| 2,807,777 | 9/1957 | Doll | 324/3 |
| 3,509,469 | 4/1970 | Strange | 324/41 |
| 3,996,510 | 12/1976 | Guichard | 324/41 |

FOREIGN PATENT DOCUMENTS

| | | | |
|---|---|---|---|
| T6963 | 9/1955 | Germany | 324/41 |

*Primary Examiner*—Robert J. Corcoran

*Attorney, Agent, or Firm*—Karl F. Ross

[57] ABSTRACT

An electromagnetic detector sensitive to the intrusion of a metallic mass (e.g., a road vehicle) into its field of radiated energy comprises, disposed on a metallic support, a transmitter coil and two strongly coupled receiver coils. These receiver coils are located at a distance from the transmitter coil and on opposite sides of the axis thereof. The axis of the transmitter coil and the common axis of the receiver coils are roughly perpendicular to each other. The presence of a metallic mass in the field around the detector induces signals in the receiver coils varying in relative phase according to the extent of the modification of the generated electromagnetic field. The output voltages of the receiver coils are combined to form a resultant square wave comparison with a reference square wave produces an output signal depending on the phase difference thereof.

13 Claims, 3 Drawing Figures

ELECTROMAGNETIC DETECTOR RESPONSIVE TO A MODIFICATION OF RADIATED FIELD BY AN INTRUDING METALLIC OBJECT

FIELD OF THE INVENTION

The present invention relates to an electromagnetic detector responsive to a modification of a field of radiated energy by the intrusion of a metallic object, particularly for the monitoring of road traffic.

BACKGROUND OF THE INVENTION

In the field of road traffic which tends to increase daily, research has been carried out to facilitate as far as possible the flow of the vehicles by the opening of detours when traffic slows down significantly on account of the increasing number of vehicles which accumulate on a roadway or on a section thereof. The facilities which may thus be offered to road traffic to render it more fluid are based on the knowledge of a certain number of data concerning the vehicles, which data may include the presence of a vehicle, its passage at a given place, possibly its speed, its direction, and the like.

All these items of information may be conventionally obtained, from magnetic detectors or sensors wherein a transmitter radiates electromagnetic energy, which can be picked up by one or more receiver coils forming part of the detector. A metallic mass (e.g., a vehicle) entering the field of radiated energy disturbs the latter and gives rise to a signal in the output of the receiver coils.

A known magnetic detector of this type comprises a transmitter coil and two receiver coils coaxial therewith which are weakly coupled to the transmitter coil and are connected in opposition to each other whereby, in the absence of a conductive mass in the field produced by the transmitter coil, the voltages induced in the receiver coils are in balance. The presence of a metallic mass in the field produces a modification therein which is manifested by the appearance of a finite voltage in the output of the receiver coils. This output voltage is utilized in load circuits connected on the downstream side of the detector.

A detector of the type just described, however, has a number of drawbacks due prinicipally to the collinearity of the receiver coils to their weak mutual coupling which require relatively large physical dimensions of the detector. Even with a precise mechanical presetting of the three coils with respect to one another it is possible, however, that an output signal is generated in the absence of an intruding object by the natural environment of the road.

OBJECTS OF THE INVENTION

An object of the present invention is, therefore, to provide an electromagnetic detector which avoids the aforementioned drawbacks.

Another object of our invention is to provide means in such a detector for automatically stabilizing the output thereof against changing environmental influences.

SUMMARY OF THE INVENTION

We realize these objects, in accordance with the present invention, by the provision of field-generating means including a transmitter coil connected to a source of alternating current and centered on a first axis, together with pick-up means including a pair of closely juxtaposed receiver coils disposed on opposite sides of that first axis and substantially centered on a second axis which is generally transverse to that first axis and spaced from the transmitter coil. A pair of amplifiers, respectively connected to the two receiver coils, are provided with individual gain-control inputs for varying the amplitudes of currents induced in these receiver coils; the amplified currents are combined with the aid of summing means to produce a resultant oscillation varying in phase — with respect to a reference oscillation derived from the a-c source through suitable circuit means — with the relative amplitudes of the currents supplied by the amplifiers. The circuit means and the summing means are connected, preferably via respective converters translating their oscillations into square waves, to a phase comparator which may be of the digital type and which has a pair of output terminals that are respectively energizable in response to phase differences of one sign or the other. These output terminals are connected to the gain-control inputs of the associated amplifiers by way of slow-acting feedback means for maintaining a cophasal relationship between the reference oscillation and the resultant oscillation in the absence of an intruding metallic object. The output terminals of the phase comparator are also connected to a load circuit or utilization means.

Owing to the slow action of the feedback connections from the phase comparator, the cophasal relationship between the reference and resultant oscillations will not be restored immediately upon a modification of the field of electromagnetic energy radiated by the transmitter coil and picked up by the receiver coils, such restoration or rebalancing occurring only with a certain delay so that transient field modifications give rise to output signals exploitable by the utilization means. With a large enough time constant, these output signals will remain in existence for a while if the intruding object (e.g., a vehicle in the case of a traffic-monitoring system) remains stationary alongside the detector.

In order to insure that a resultant oscillation is normally available at the corresponding input of the phase comparator, we prefer to provide a weak coupling between the transmitter coil and the receiver coils even in the absence of an intruding object, advantageously by somewhat inclining the common axis of the two receiver coils with reference to a line perpendicular to the axis of the transmitter coil.

BRIEF DESCRIPTION OF THE DRAWING

The above and other features of our invention will now be described in detail with reference to the accompanying drawing in which.

Specific Description

Figure 1:
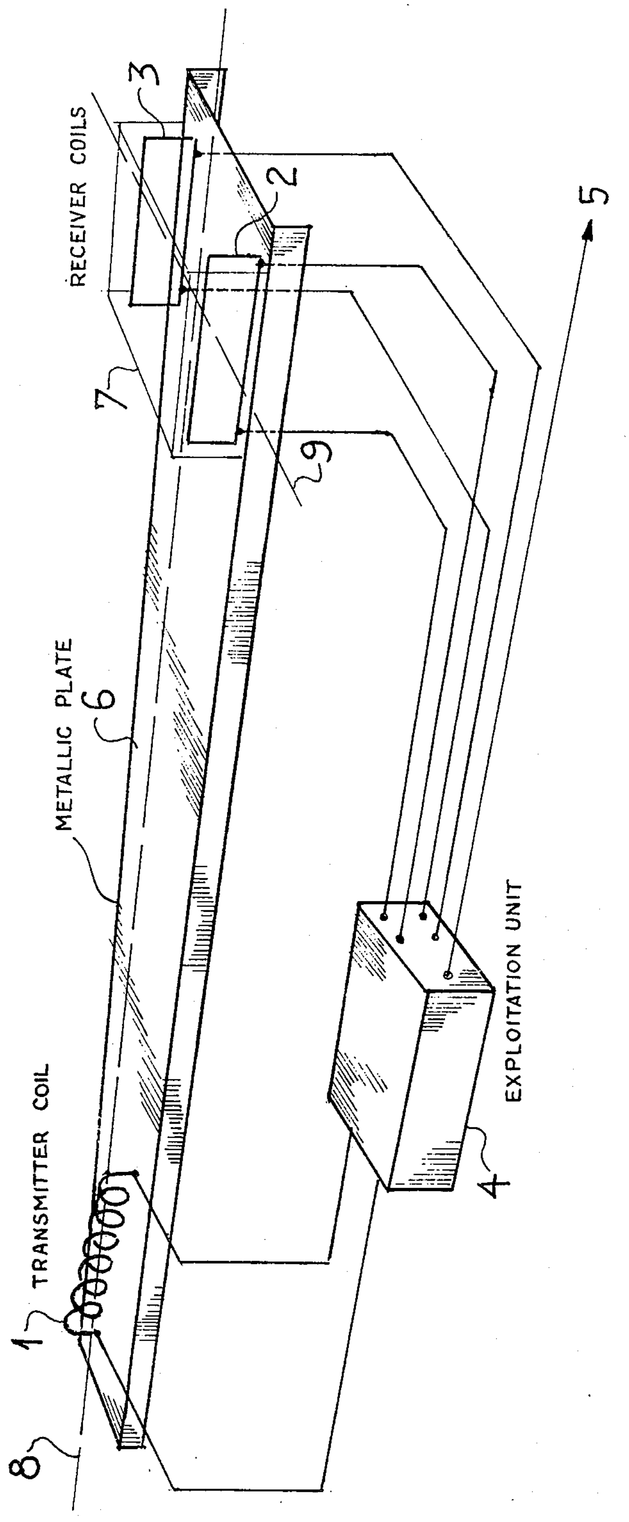
FIG. 1 is a schematic view of a detector embodying our invention.

In FIG. 1 we have illustrated the basic principles of an electromagnetic detector according to the invention.

It comprises a transmitter coil in the form, for example, of a solenoid which may contain a ferrite bar whose axis 8 is horizontal. The coil 1 is connected to an exploitation unit 4 producing an output signal. This unit supplies current to this coil 1 which produces in known manner a magnetic field H. Out improved detector also comprises two receiver coils 2, 3 located at a certain distance, of the order of a few decimeters, for the transmitter coil 1 with which they are weakly coupled. These receiver coils 2, 3, which are preferably loop aerials or antennas, have their axis 9 perpendicular to the axis 8 of the transmitter coil and are disposed on opposite sides of this axis 8. As they are near to each other, the receiver frames are strongly coupled and this promotes the establishment, between the receiver and transmitter voltages, of a phase relationship which is processed in the associated circuits. The control circuit 4 is connected to these frames and also connected to utilization circuitry generally designated 5.

The active elements of the detector just described rest on a metal base plate 6 which forms both an electrostatic and a magnetic screen, an additional electrostatic screen 7 surrounding the receiver frames 2 and 3. The presence of the matallic base plate renders the detector much less sensitive to the effects of the subjacent ground and the screen 7 reduces the sensitivity of the detector to electrostatic variations of the environment and even eliminates the disturbance created by the passage of a person in the zone of sensitivity.

It will be observed that the axis of the receiver coils extends substantially horizontally and generally transversely to the axis 8 of the detector, this disposition enabling the establishment of a detection zone, of significant extent on both sides of the detector axis. The detector is then disposed on the axis of the path of the traffic to be monitored and in the middle thereof. Owing to this disposition, the reading of the phase variation is different depending on whether the vehicle moves to the left or to the right of the axis of the detector and also on its direction of motion, that is to say whether it moves from the transmitter coil toward the receiver coils or in the opposite direction, with relative inversion of the sign of the phase difference in these two instances. When a metallic mass is disposed in the zone of sensitivity of the detector or when a vehicle enters this zone, eddy currents are produced and create an electromagnetic field which is superposed upon that of the transmitter coil at the considered point. Consequently, there is a variation in amplitude and phase of the voltages induced in the receiver coils.

According to the invention, this phase variation is utilized, which has the advantage over the utilization of the amplitude of the resultant signal of being much less sensitive to disturbances due to the environment.

Figure 2:
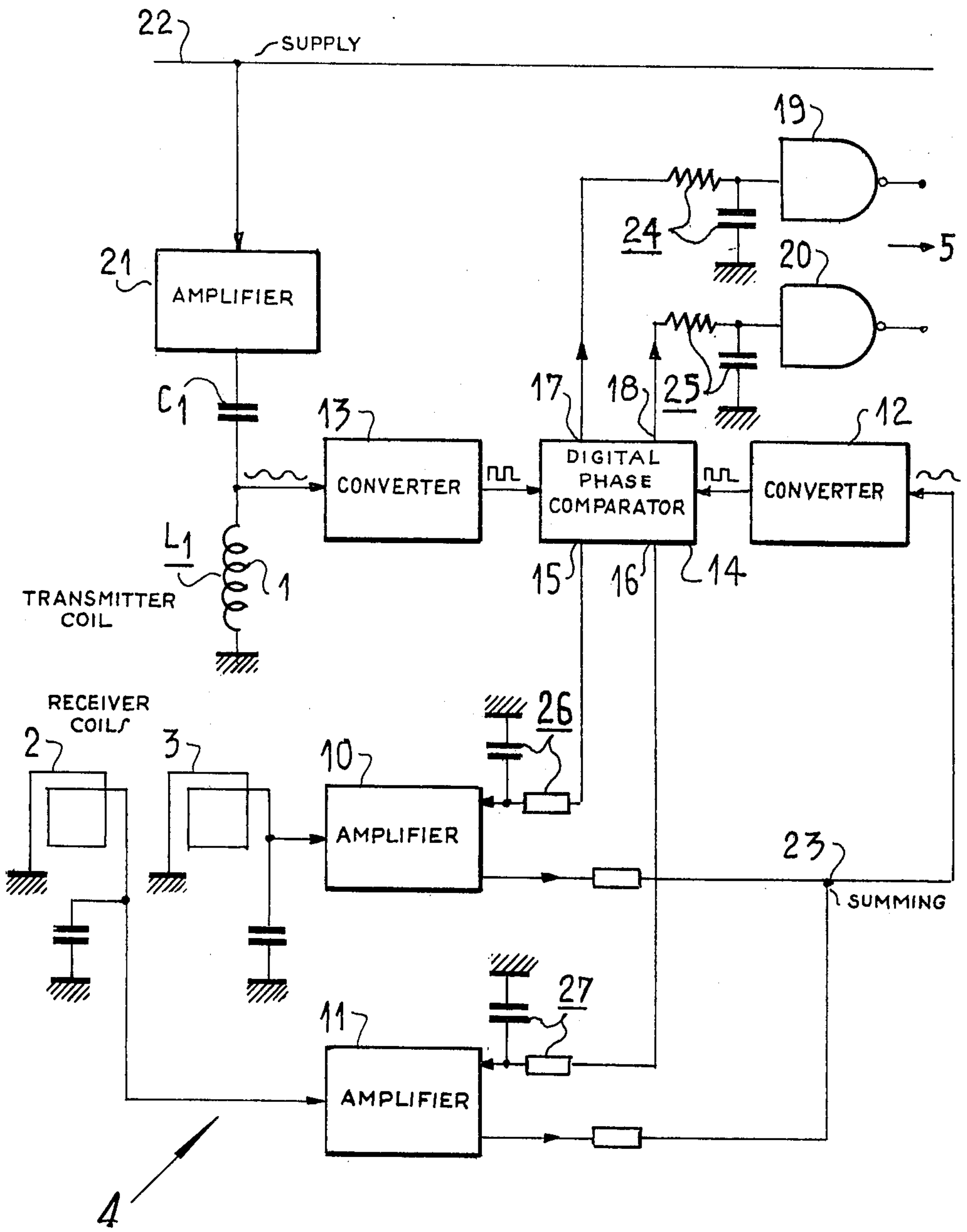
FIG. 2 is a block diagram of an exploitation unit included in the detector of FIG. 1.

FIG. 2 shows diagrammatically organization of the exploitation unit 4. Reference numerals 1, 2 and 3 represent respectively the transmitter coil having an inductance $L_1$ and the receiver coils in the form of antenna loops. Each of these loops is connected to a receiver amplifier 10, 11 whose outputs are combined and connected to a converter circuit 12 which converts the sinusoidal voltage received into a square voltage. The transmitter coil 1 is also connected to a converter circuit 13 which converts the sinusoidal voltage it receives into a square-wave voltage serving as a reference oscillation. This conversion of the sinusoidal signals into square-wave signals contributes to rendering them practically completely insensitive to any additional disturbances which may be superimposed upon the sinusoidal signal.

The two converter circuits 12 and 13 supply their respective square waves a phase comparator 14 having two outputs 15 and 16, connected via respective RC networks 26 and 27 to gain-control inputs of amplifiers 10 and 11, and two other outputs 17 and 18 giving items of information on data relating to the object sensed by the detector, depending on its position with respect to its axis, which are read out by logic circuitry 19–20. A line 22 supplies current to the coil 1 at a frequency of 50 Khz through an amplifier 21. Two smoothing networks in the form of RC circuits 24 and 25 eliminate rapid fluctuations of the output signal. Networks 26 and 27 integrate the pulses resulting from the digital comparison of the received and reference waves in comparator 14.

The system operates in the following manner:

As the transmitter coil 1 is supplied with a sinusoidal voltage by the line 22 through the amplifier 21, a current flowing through this coil creates a magnetic field around the coil. The field induces currents in the receiver coils 2, 3 which are located on opposite sides of the axis of the transmitter coil and are coupled therewith. In the absence of a metallic mass disturbing the field, it is desired to obtain a resultant signal issuing from the receiver coils 2 and 3 which is in phase with the reference signal delivered by the converter 13 and which therefore requires a non-zero current at the output of the receiver coils. According to an advantageous feature of our invention, this effect is obtained by the creation of a certain angular offset between the axis 8 of the transmitter coil 1 and the plane of symmetry of the receiver coils 2 and 3. In other words, the angle between the axes 8 and 9 which should normally be 90° differs therefrom sufficiently to ensure that the resultant of the currents induced in the receiver coils is no longer zero but has a finite value which may be processed by the exploitation unit 4. This arrangement is particularly advantageous compared to the prior art referred to above where the operation of the detector was unpredictable even with precise presetting.

The feedback by way of integrating networks 26 and 27 automatically stabilizes the detector and also permits a compensation of unbalancing effects of the environment and of slow drifts occuring in certain circuit components. For this purpose, the signals issuing respectively from the receiver coils 2 and 3 are amplified separately in the amplifiers 10 and 11 which have separate gain controls, and are then combined in a summing circuit 23 (more fully shown in FIG. 3) connected to the outputs of the amplifiers 10 and 11. At point 23 there is thus obtained a vector signal, resulting from the addition of the amplified signals, whose phase consequently varies, as a function of the unbalance of the gains of the amplifiers, with respect to that of the reference oscillation fed to converter 13. The phase comparator 14 receiving, on the one hand, the resultant signal and, on the other hand, the reference signal after they have been converted into square waves in the converters 12 and 13, respectively, determines the phase difference between the two signals and delivers in accordance with the signs of this phase difference a feedback voltage, through the outputs 15, 16 and integrators 26, 27, to either of the amplifiers 10 and 11 so as to modify their gain in such manner that the resultant signals is in phase with the reference oscillation.

It should be noted that the comparison of the phases of the resultant and reference oscillations, issuing from converters 12 and 13 in the form of square waves is effected digitally. It will also be observed that the unbalancing of the detector is effected relatively slowly owing to the fact that the integrating networks 26, 27 controlling the gain of the amplifiers 10 and 11 have a large time constant. Under these conditions, the feedback system cannot immediately react to the occurrence of rapid phase differences produced by the appearance of a metallic mass such as that of a vehicle in the electromagnetic field radiated by the transmitter coil. Thus there appears at either of the outputs 17 and 18 of the phase comparator 14 a voltage which indicates the presence of a vehicle which has stopped in the immediate vicinity of the detector when this voltage is sustained, or the presence of a moving vehicle when this voltage has a pulse form.

The output at which the voltage appears gives an indication of the position of the vehicle with respect to the detector axis or of the direction in which it moves. The signal is in fact a logic level which is sent via smoothing networks 24, 25 and gates 19–20 to the utilization circuitry 5 not further illustrated.

Figure 3:
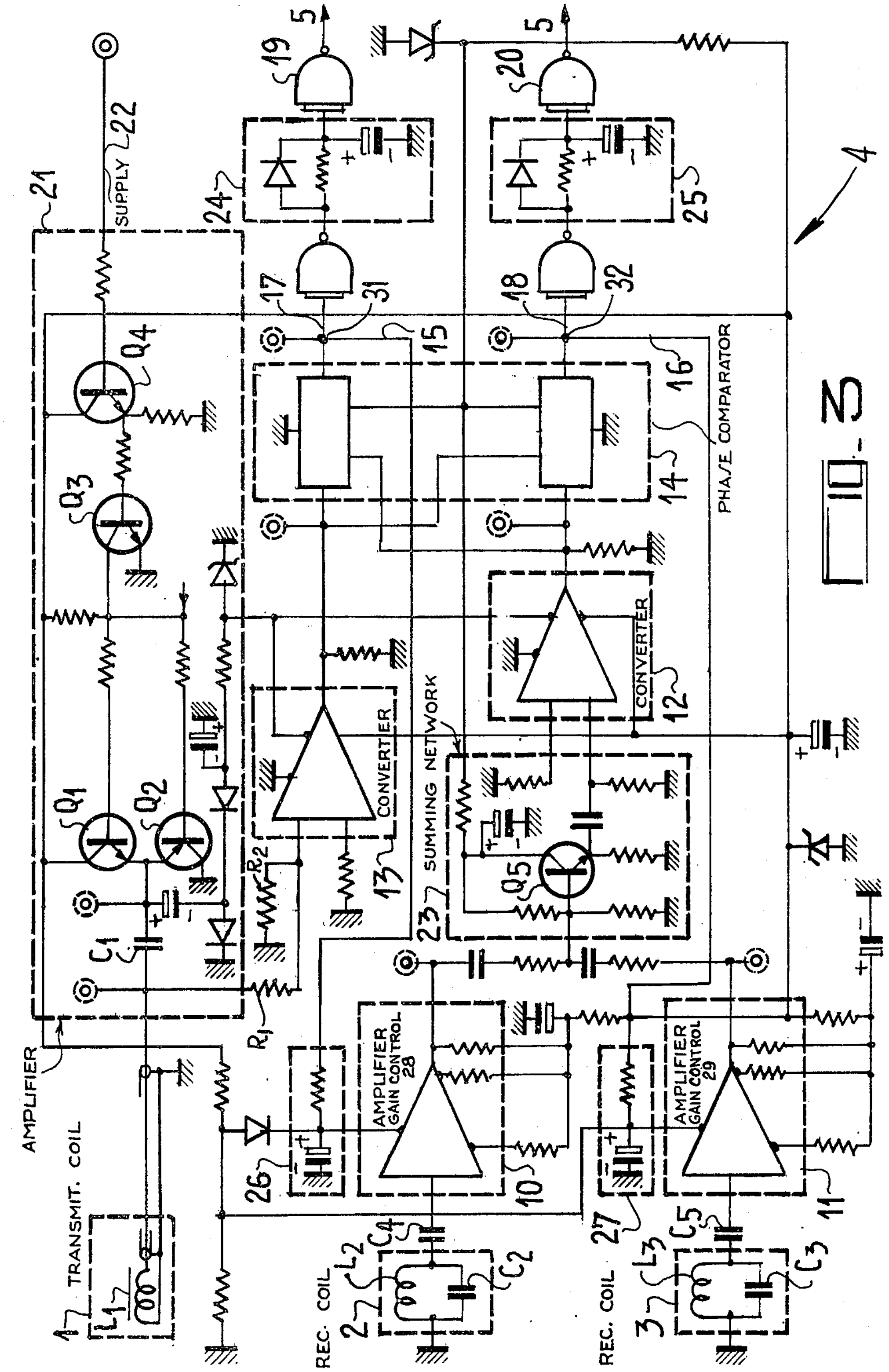
FIG. 3 is a more detailed diagram of the exploitation unit shown in FIG. 2.

FIG. 3 gives a more detailed diagram of the circuits shown in FIG. 2.

The inductance $L_7$ of transmitter coil 1 lies in series with an output capacitor $C_1$ of the amplifier 21 through which the coil is energized by the supply line 22. The energy radiated by the coil 1 is sinusoidal in conformity with the current flowing in the tuned circuit $L_1$, $C_1$. Between the coil 1 and the capacitor $C_1$ there is taken off a voltage which is in phase quadrature with reference to the supply voltage delivered by the conductor 22 and is delivered to converter 13 by circuit means including a voltage divider $R_1$, $R_2$. Amplifier 21 is shown as comprising several transistors $Q_1$–$Q_4$.

The two receiver coils 2 and 3, constituting respective parallel-resonant circuits $L_2$, $C_2$ and $L_3$, $C_3$, pick up from the transmitter coil a certain amount of energy which creates voltages at the terminals of these tuned circuits that are substantially in phase opposition. Operational amplifiers 10, 11 having separate gain-control inputs 28, 29, receive through respective capacitors $C_4$ and $C_5$ the voltages issuing from the coils 2 and 3. The output signals of these amplifiers are both applied to the base of a semiconductor element in the shape of an NPN transistor $Q_5$ forming part of summing circuit 23. The resultant output signal of the circuit 23 has a phase which varies, as a function of the unbalance of the gains of the amplifiers 10 and 11, with respect to the reference oscillation. Phase comparator 14 has two output terminals 31, 32 respectively connected to output leads 15, 17 and 16, 18.

If the gain AG of the amplifier 10 is a maximum and the gain AD of the amplifier 11 is a minimum, the resultant has a phase close to that of the voltage received by coil 3.

If the gain AG is a minimum and the gain AD is a maximum, the resultant has a phase substantially equal to that of the voltage received by coil 2. With any intermediate value of the gain, the resultant has a phase between the two preceding values; thus, the phase can vary over a range close to 180°.

Thus, the system may be rebalanced for an infinity of values of the gains AG and AD when the environment destroys the initial balance or there are drifts of the components of the system.

A detector of this type the physical dimensions of which are relatively small, of the order of a meter, is buried in the road in a direction parallel to and preferably along the centerline of the latter, though it could also be disposed at an edge of the road.

A certain number of observations may be deduced from the foregoing description which either are characteristic of the detector or impart thereto marked advantages.

The utilization of the phase of the resultant signal has for result that the detector is much less sensitive to disturbances and that, on the other hand, owing to the systematic dissymetry introduced in the relative positions of the transmitter and receiver coils, it is possible to automatically compensate for errors which might be introduced by the environment, by means of a control circuit so that delicate presetting can be avoided. This arrangement also minimizes the blind zones.

Furthermore, the fact that a stationary vehicle determines a resultant signal issuing from the circuit 23 with a significant phase variation which saturates the control and is manifested by a sustained voltage at the outputs 17 and 18 of the phase comparator 14, enables two zones of sensitivity to be defined around the detector, namely a small zone in which stationary vehicles are detected and another, larger zone in which moving vehicles are detected.

The location of the receiver coils on opposite sides of the axis of the transmitter coil, and the strong coupling therebetween, has for result that the phase diagram depends on the frequency.

Under these conditions, an automatic remote-controlled testing of the operation of the detector may be carried out by means of a sudden variation in the frequency. Indeed, as the circuits of the receiver coils 2 and 3 are tuned, a modification in the nominal frequency of the reference signal, which is normally in the described embodiment 50 Khz, results in a different variation of the phases of the signals delivered by the coils 2 and 3 and consequently varies the resultant signal in the output of summing circuit 23. This variation causes the presence of an information at the outputs 17 and 18 of the comparator 14 which is delivered by the logic gates 19 or 20. The presence of these items of information is proof of a correct-operation of the detector. This correct operation test is usually carried out when no vehicle is in proximity of the detector.

What is claimed is:

1. An electromagnetic detector responsive to the intrusion of a metallic object into a radiated energy field, comprising:

field-generating means including a transmitter coil centered on a first axis and a source of alternating current connected to said transmitter coil;

pick-up means including a pair of closely juxtaposed receiver coils disposed on opposite sides of said first axis, said receiver coils being substantially centered on a second axis spaced from said transmitter coil and generally transverse to said first axis;

circuit means for deriving a reference oscillation from said source;

a pair of amplifiers respectively connected to said receiver coils, said amplifiers being provided with individual gain-control inputs for varying the amplitudes of currents induced in the associated receiver coils;

summing means connected to said amplifiers for combining the amplified currents thereof into a resultant oscillation varying in phase, with respect to said reference oscillation, with the relative amplitudes of said amplfied currents;

phase-comparison means connected to said circuit means and to said summing means for receiving said reference oscillation and said resultant oscillation therefrom, said phase-comparison means having a pair of output terminals respectively energizable in response to phase differences of different sign;

slow-acting feedback means connecting each of said output terminals to a respective one of said gain-control inputs for maintaining a cophasal relationship between said reference oscillation and said resultant oscillation in the absence of an intruding metallic object; and utilization means connected to said output terminals.

2. A detector as defined in claim 1 wherein said receiver coils are weakly coupled with said transmitter coil.

3. A detector as defined in claim 2 wherein said receiver coils are loop antennas.

4. A detector as defined in claim 2 wherein said second axis is inclined to said first axis at an angle differing sufficiently from 90° to give rise to a resultant oscillation of finite amplitude in the absence of an intruding metallic object.

5. A detector as defined in claim 1, further comprising first converter means inserted between said summing means and said phase-comparison means and second converter means inserted between said circuit means and said phase-comparison means for translating said resultant and reference oscillations into square waves.

6. A detector as defined in claim 5 wherein said phase-comparison means comprises a digital phase comparator emitting pulses on said output terminals.

7. A detector as defined in claim 6 wherein said feedback means includes an RC network for the integration of said pulses in series with said gain-control inputs.

8. A detector as defined in claim 6, further comprising a pair of smoothing networks connected between said output terminals and said utilization means.

9. A detector as defined in claim 8, further comprising logic circuitry inserted between said smoothing networks and said utilization means.

10. A detector as defined in claim 1 wherein said field-generating means further includes a tuning capacitor in series with said transmitter coil.

11. A detector as defined in claim 10 wherein said circuit means is connected to a junction of said tuning capacitor with said transmitter coil.

12. A detector as defined in claim 1, further comprising a common metallic base plate supporting said transmitter and receiver coils.

13. A detector as defined in claim 12, further comprising electrostatic screen means surrounding said receiver coils above said base plate.

* * * * *